United States Patent
Akita et al.

[11] Patent Number: 6,128,234
[45] Date of Patent: Oct. 3, 2000

[54] REDUNDANT DECISION CIRCUIT FOR SEMICONDUCTOR MEMORY DEVICE

[75] Inventors: Tamiji Akita, Sapporo; Katsuya Yoshida, Kanagawa, both of Japan

[73] Assignee: Fujitsu Limited, Kanagawa, Japan

[21] Appl. No.: 09/310,192

[22] Filed: May 12, 1999

[30] Foreign Application Priority Data

Oct. 27, 1998 [JP] Japan .................................. 10-305492

[51] Int. Cl.[7] .................................................. G11C 7/00
[52] U.S. Cl. ............................................. 365/200; 365/96
[58] Field of Search ............................ 365/200, 96, 201; 327/525

[56] References Cited

U.S. PATENT DOCUMENTS

| | | | |
|---|---|---|---|
| 4,935,899 | 6/1990 | Morigami | 365/200 |
| 5,233,566 | 8/1993 | Imamiya et al. | 365/200 |
| 5,345,110 | 9/1994 | Renfro et al. | 307/272.3 |
| 5,444,650 | 8/1995 | Abe et al. | 365/96 |
| 5,485,424 | 1/1996 | Kawamura | 365/200 |
| 5,566,107 | 10/1996 | Gilliam | 365/200 |
| 5,663,902 | 9/1997 | Bennett et al. | 365/96 |
| 5,677,884 | 10/1997 | Zagar et al. | 365/200 |
| 5,929,691 | 7/1999 | Kim et al. | 327/525 |
| 5,999,038 | 12/1999 | Pathak et al. | 327/525 |

*Primary Examiner*—Richard Elms
*Assistant Examiner*—Anh Phung
*Attorney, Agent, or Firm*—Arent Fox Kintner Plotkin & Kahn PLLC

[57] ABSTRACT

A redundancy decision circuit for specifying a redundant memory cell in a memory cell array when a normal cell is defective. The circuit includes a switching element, a fuse and a load circuit connected in series between high and low potential supplies. A switching driver drives the switching element. A hold circuit latches the potential at a node between the switching element and one of either the fuse and the load circuit. The circuit then generates a redundant decision signal.

15 Claims, 7 Drawing Sheets

REDUNDANT DECISION CIRCUIT FOR SEMICONDUCTOR MEMORY DEVICE

BACKGROUND OF THE INVENTION

The present invention generally relates to a semiconductor memory device, and, more particularly, to a redundant decision circuit for specifying a redundant memory cell in a memory cell array when a normal cell is defective.

To improve yield, a semiconductor memory device includes a redundant function that replaces a defective cell with a redundant cell in a cell array in the manufacturing process. For the redundant function, a redundant decision circuit is provided which generates a redundant signal in accordance with the cutting of a fuse of the defective cell. FIG. 1 is a schematic block diagram of a first conventional redundant decision circuit 100. A one-shot pulse generation circuit generates a control signal $\phi 1$ having a power supply VDD level after a predetermined time has elapsed from the start-up of the power supply VDD. The control signal $\phi 1$ is supplied to the gate of a P-channel MOS transistor Tr1. The source of the transistor is connected to the power supply VDD, and the drain (a node N1) is connected to a power supply Vss via a fuse 2. The node N1 is connected to an input terminal of a hold circuit 3. The hold circuit 3 supplies complementary redundant signals R, /R to a row decoder (not shown) in accordance with a potential at the node N1 after power-on. For example, when the redundant signal R goes high and the redundant signal /R goes low, the row decoder stops access to the defective cell in a memory cell array and accesses the previously specified redundant cell.

FIG. 2 is a waveform diagram of the power supply and control signal in the first conventional redundant decision circuit 100. When the power supply VDD is turned on, the control signal $\phi 1$ rises to the power supply VDD level after the predetermined delay time has elapsed from the start-up of the power supply VDD. The transistor Tr1 is turned on for a predetermined time t1 after the potential difference has become greater than the threshold and until the potential difference between the power supply VDD and control signal $\phi 1$ becomes smaller than a threshold of the transistor Tr1.

When the fuse 2 is not cut, the drain current of the transistor Tr1 flows in the power supply Vss via the fuse 2, and the node N1 is maintained at substantially the low potential power supply Vss level. The hold circuit 3 maintains the node N1 at an L level and outputs a redundant signal R Low and a redundant signal /R High. The hold circuit 3 maintains the output states of the redundant signals R, /R even if the transistor Tr1 is turned off after the predetermined time t1 has elapsed.

When the fuse 2 is cut, the node N1 rises to substantially the power supply VDD level for the predetermined time t1. Hereupon, the hold circuit 3 outputs the redundant signal R High and the redundant signal /R Low. The hold circuit 3 maintains the output states of the redundant signals R, /R even if the transistor Tr1 is turned off after the predetermined time t1 has elapsed.

In the first conventional redundant decision circuit 100, as shown by dotted lines in FIG. 2, when the start-up of the power supply VDD supplied to the source of the transistor Tr1 is slow under the cut state of the fuse 2, the on time t1 of the transistor Tr1 is shortened. This is because the control signal $\phi 1$ rises before the potential difference between the gate and source of the transistor Tr1 becomes sufficiently greater than the threshold. Hereupon, a sufficient drain current does not flow to the transistor Tr1 and the potential at the node N1 does not rise sufficiently. As a result, although the fuse 2 is cut, the hold circuit 3 outputs the redundant signal R Low and the redundant signal /R High. Moreover, when a leak current flows in the cut fuse 2, the potential rise at the node N1 is further suppressed and the probability of causing an incorrect decision increases.

To overcome such a problem, the on time t1 of the transistor Tr1 could be prolonged by further delaying the rising edge of the control signal $\phi 1$. However, in this case, the penetration current flowing in the power supply Vss from the power supply VDD via the transistor Tr1 and the fuse 2 increases. Moreover, the delay time of the one-shot pulse generation circuit 1 is set using a MOS (metal oxide semiconductor) capacitance. Accordingly, to prolong the delay time, the capacitance needs to be increased. However, a large MOS capacitance increases the circuit area of the one-shot pulse generation circuit 1.

FIG. 3 is a schematic block diagram of a second conventional redundant decision circuit 200. A control signal $\phi 2$ generated by a one-shot pulse generation circuit 4 is supplied to the gate of an N-channel MOS transistor Tr2. The source of the transistor Tr2 is connected to the power supply Vss, and its drain (a node N2) is connected to the power supply VDD via the fuse 2. An input terminal of the hold circuit 3 is connected to the node N2. When the redundant signal R goes low and the redundant signal /R goes high, the row decoder (not shown) stops access to the defective cell in the memory cell array and accesses the previously specified redundant cell.

FIG. 4 is a waveform diagram of the power supply and control signal of the second conventional redundant decision circuit 200. When the power supply VDD is turned on, after a predetermined time has elapsed from the start-up of the power supply VDD, the control signal $\phi 2$ having the power supply VDD level is generated. The transistor Tr2 is turned on for the predetermined time t2 until the potential difference between the power supply Vss and the control signal $\phi 2$ becomes smaller than the threshold of the transistor Tr2 after the potential difference has become greater than the threshold.

When the fuse 2 is not cut, a drain current is supplied from the power supply VDD to the transistor Tr2 via the fuse 2, and the node N2 is maintained at substantially the power supply VDD level in accordance with the resistance ratio between the fuse 2 and the transistor Tr2. The hold circuit 3 maintains the node N2 at the H level and outputs the redundant signal R High and the redundant signal /R Low.

When the fuse 2 is cut, the potential at the node N2 drops to substantially the power supply Vss level. Hereupon, the hold circuit 3 outputs the redundant R Low and the redundant signal /R High.

In the second conventional redundant decision circuit 200, when a leak current flows in the cut fuse 2, the potential drop at the node N2 is suppressed. Hereupon, although the fuse 2 is cut, the hold circuit 3 may output the redundant signal R High and the redundant signal /R Low.

To overcome such a problem, the on time t2 of the transistor Tr2 could be prolonged by further delaying the falling edge of the control signal $\phi 2$. However, in this case, the penetration current flowing in the power supply Vss from the power supply VDD via the fuse 2 and the transistor Tr2 increases. Moreover, to prolong the delay time of the one-shot pulse generation circuit 4, a MOS capacitance needs to be increased, which increases the circuit area of the one-shot pulse generation circuit 4.

It is an object of the present invention to provide a redundant decision circuit that prevents an incorrect decision when a fuse is cut, without increasing power consumption and circuit area.

SUMMARY OF THE INVENTION

In a first aspect of the present invention, a redundant decision circuit is provided that includes a switching element, a switching driver connected to the switching element for driving the switching element, a fuse, and a load circuit connected in series with the fuse. One of the fuse and the load circuit is connected to the switching element. A hold circuit is connected to a node between the switching element and one of the fuse and the load circuit, latches a potential at the node and generates a redundant decision signal.

In a second aspect of the present invention, a redundant decision circuit is provided that includes a switching element connected between a high potential power supply and a node, a switching driver connected to the switching element for driving the switching element, a fuse, a load circuit connected in series with the fuse between a low potential power supply and the node, and a hold circuit, connected to the node, for latching a potential at the node and generating a redundant decision signal.

In a third aspect of the present invention, a redundant decision circuit is provided that includes a switching element connected between a low potential power supply and a node, a switching driver connected to the switching element for driving the switching element, a fuse, a load circuit connected in series with the fuse between a high potential power supply and the node, and a hold circuit, connected to the node, for latching a potential at the node and generating a redundant decision signal.

In a fourth aspect of the present invention, a semiconductor memory device is provided that includes a memory cell array including a normal cell array and a redundant cell array, a redundant decision circuit for generating a redundant decision signal, and a decoder, connected to the redundant decision circuit, for performing a redundant operation to select a normal cell of the normal cell array or a redundant cell of the redundant cell array in accordance with the redundant decision signal. The redundant decision circuit includes a switching element, a switching driver connected to the switching element for driving the switching element, a fuse, a load circuit connected in series with the fuse. One of the fuse and the load circuit is connected to the switching element. A hold circuit is connected to a node between the switching element and one of the fuse and the load circuit, latches a potential at the node and generates the redundant decision signal.

In a fifth aspect of the present invention, a semiconductor memory device is provided that includes a memory cell array including a normal cell array and a redundant cell array, a redundant decision circuit for generating a redundant decision signal, and a decoder, connected to the redundant decision circuit, for performing a redundant operation to select a normal cell of the normal cell array or a redundant cell of the redundant cell array in accordance with the redundant decision signal. The redundant decision circuit includes a switching element connected between a high potential power supply and a node, a switching driver connected to the switching element for driving the switching element, a fuse, a load circuit connected in series with the fuse between the low potential power supply and the node, and a hold circuit, connected to the node, for latching a potential at the node and generating the redundant decision signal.

In a sixth aspect of the present invention, a semiconductor memory device is provided that includes a memory cell array including a normal cell array and a redundant cell array, a redundant decision circuit for generating a redundant decision signal, and a decoder, connected to the redundant decision circuit, for performing a redundant operation to select a normal cell of the normal cell array or a redundant cell of the redundant cell array in accordance with the redundant decision signal. The redundant decision circuit includes a switching element connected between a low potential power supply and a node, a switching driver connected to the switching element for driving the switching element, a fuse, a load circuit connected in series with the fuse between a high potential power supply and the node, and a hold circuit, connected to the node, for latching a potential at the node and generating the redundant decision signal.

In a seventh aspect of the present invention, a method for deciding redundancy is provided. First, a fuse, a load circuit and a switching element are connected in series between a high potential power supply and a low potential power supply. Then, the switching element is drove to generate a potential at a node between the switching element and the fuse. The potential at the node varies by a voltage drop generated by the load circuit. The potential at the node is held to generate a redundant decision signal.

In an eighth aspect of the present invention, a method for deciding redundancy is provided. First, a switching element is connected to a high potential power supply, and a fuse and a load circuit are connected in series between the switching element and a low potential power supply. Then the switching element is drove to generate a potential at a node between the switching element and the fuse. The potential at the node increases by a voltage drop generated by the load circuit. Then, the potential is held at the node to generate a redundant decision signal.

In a ninth aspect of the present invention, a method for deciding redundancy is provided. First, a switching element is connected to a low potential power supply, and a fuse and a load circuit are connected in series between the switching element and a high potential power supply. Then, the switching element is drove to generate a potential at a node between the switching element and the fuse. The potential at the node decreases by a voltage drop generated by the load circuit. Then, the potential is held at the node to generate a redundant decision signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
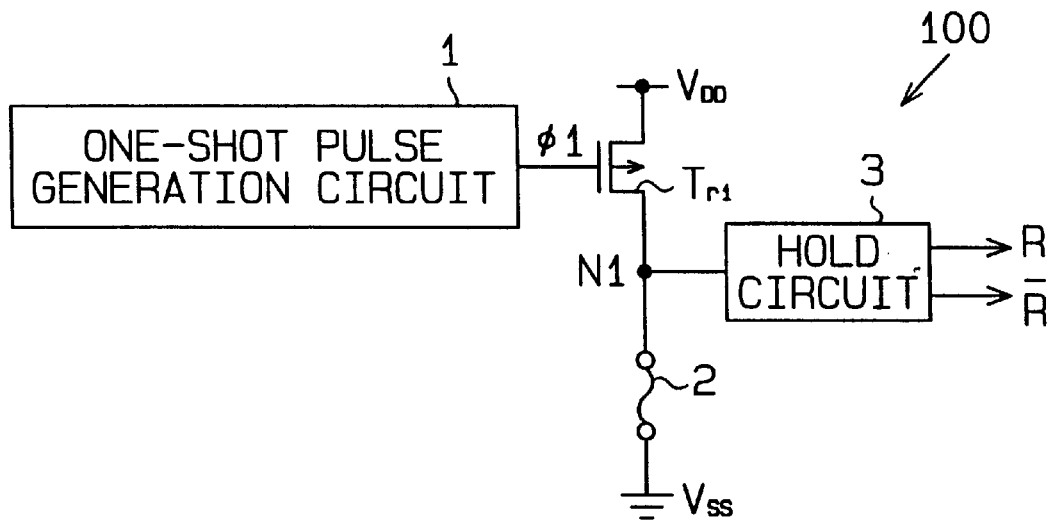
FIG. 1 is a schematic block diagram of a first conventional redundant decision circuit.

In the drawings, like numerals are used for like elements throughout.

First Embodiment

Figure 5:
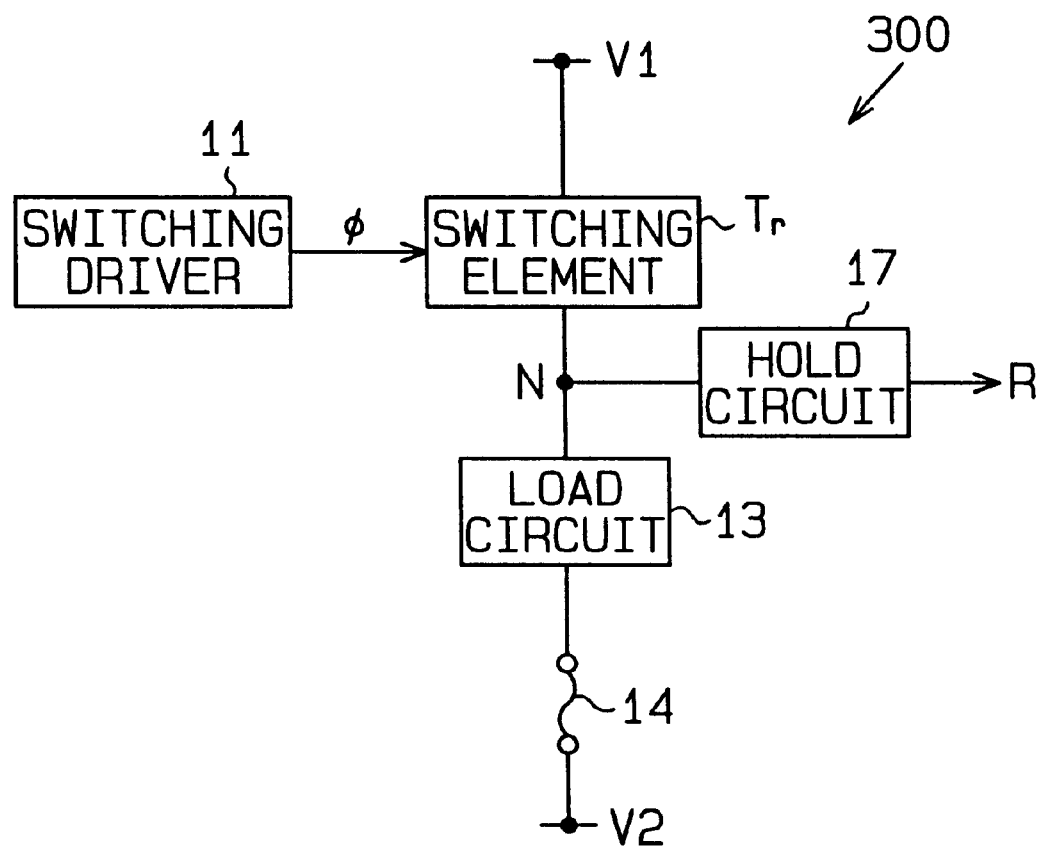
FIG. 5 is a schematic block diagram of a redundant decision circuit according to a first embodiment of the present invention.

FIG. 5 is a schematic block diagram of a redundant decision circuit 300 according to a first embodiment of the present invention. The redundant decision circuit 300 includes a switching element Tr, a load circuit 13, and a fuse 14 connected in series between a high potential power supply V1 and a low potential power supply V2. The redundant decision circuit 300 further includes a switching driver 11 that drives the switching element Tr, and a hold circuit 17 that latches the potential at a node between the switching element Tr and the load circuit 13 and outputs the latched potential. The load circuit 13 generates a voltage drop in accordance with the current flowing in the fuse 14. When a leak current flows in the fuse 14, the voltage drop generated in the fuse 14 and the voltage drop generated in the load circuit 13 effect the voltage at the node. This operation sufficiently raises or drops the node potential and prevents an incorrect decision when the fuse is cut.

Figure 6:
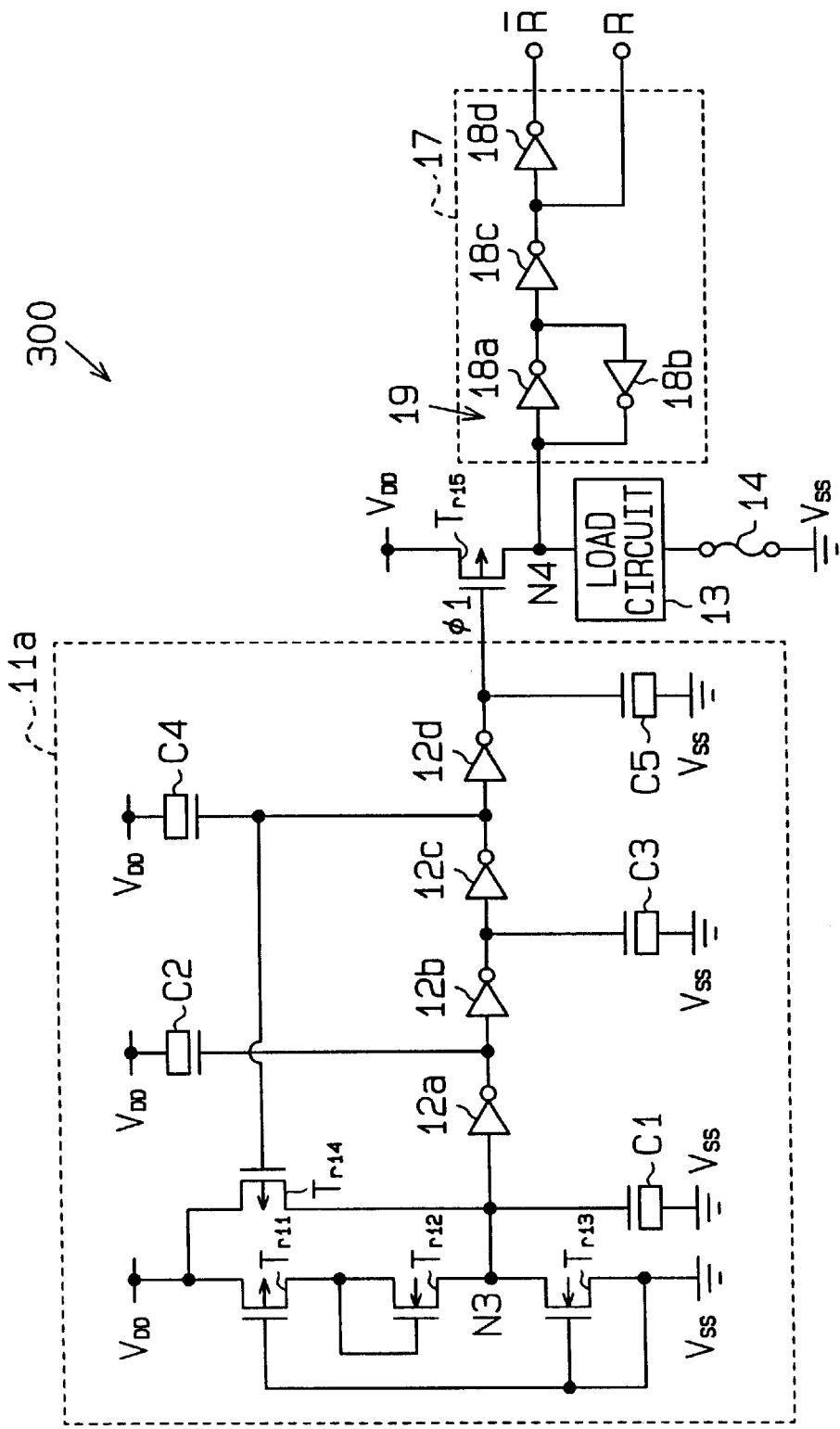
FIG. 6 is a more detailed circuit diagram of the redundant decision circuit of FIG. 5.

FIG. 6 is a circuit diagram of the redundant decision circuit 300 of FIG. 5. The switching driver 11 is a one-shot pulse generation circuit 11a in which the source of a P-channel MOS transistor Tr11 is connected to the power supply VDD, and the drain of the transistor Tr11 is connected to the gate and the drain of an N-channel MOS transistor Tr12. The source (a node N3) of the transistor Tr12 is connected to the drain of an N-channel MOS transistor Tr13, and the source of the transistor Tr13 is connected to the power supply Vss. The gates of the transistors Tr11 and Tr13 are connected together and to the power supply Vss. The node N3 is connected to the power supply Vss via a capacitor C1 and is connected to an input terminal of an inverter circuit 12a. The capacitor C1 delays the rise of the potential at the node N3. An output signal of the inverter circuit 12a is applied to the gate of a P-channel MOS transistor Tr15 as the control signal φ1 via inverter circuits 12b to 12d.

Output terminals of the inverter circuits 12a and 12c are connected to the power supply VDD via capacitors C2 and C4 and output terminals of the inverter circuits 12b and 12d are connected to the power supply Vss via capacitors C3 and C5. The capacitors C2 and C4 delay the falling edges of the output signals of the inverter circuits 12a and 12c, respectively, and the capacitors C3 and C5 delay the rising edges of the output signals of the inverter circuits 12b and 12d, respectively.

An output signal of the inverter circuit 12c is applied to the gate of a P-channel MOS transistor Tr14. The source of the transistor Tr14 is connected to the power supply VDD, and the drain is connected to the node N3.

In the one-shot pulse generation circuit 11, when the power supplies VDD and Vss are turned on, the gate potentials of the transistors Tr11 and Tr13 go low. At this time, when the potential at the node N3 is lower than the power supply Vss level by a value equal to or greater than the threshold of the transistor Tr13, the transistor Tr13 is turned on and the node N3 is pulled up to the power supply Vss level. Further, when the node N3 is equal to or greater than the power supply Vss level, the transistor Tr13 is maintained in the off state. Substantially simultaneously, the transistors Tr11 and Tr12 are turned on, and the potential at the node N3 is pulled up to the vicinity of the power supply VDD level. At this time, the rise of the potential at the node N3 is delayed due to charging of the capacitor C1.

When the potential at the node N3 rises and becomes greater than the threshold of the inverter circuit 12a, the inverter circuit 12a outputs an output signal Low. The falling edge of the output signal of the inverter circuit 12a is delayed by the capacitor C2. When the output signal of the inverter circuit 12a falls such that it is equal to or smaller than the threshold of the inverter circuit 12b, the inverter circuit 12b outputs the output signal High. The rising edge of the output signal of the inverter circuit 12b is delayed by the capacitor C3. When the output signal of the inverter circuit 12b rises over the threshold of the inverter circuit 12c, the inverter circuit 12c outputs the output signal Low. The falling edge of the output signal of the inverter circuit 12c is delayed by the capacitor C4. When the output signal of the inverter circuit 12c falls, the transistor Tr14 is turned on and the potential at the node N3 is pulled up to substantially the power supply VDD level. When the output signal of the inverter circuit 12c falls such that it is equal to or smaller than the threshold of the inverter circuit 12d, the inverter circuit 12d outputs a control signal φ1 High. The rising edge of the control signal φ1 is delayed by the capacitor C5.

Figure 2:
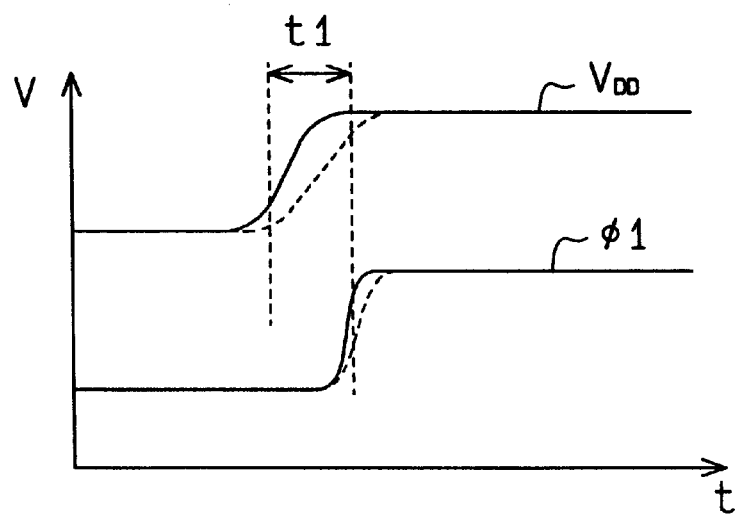
FIG. 2 is a waveform diagram of a power supply and control signal in the redundant decision circuit of FIG. 1.
Figure 3:
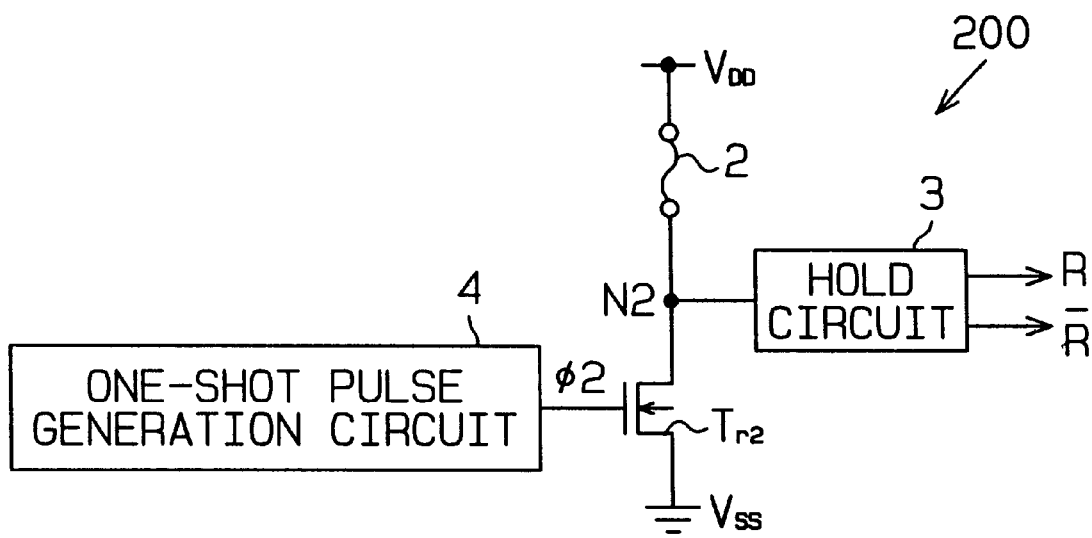
FIG. 3 is a schematic block diagram of a second conventional redundant decision circuit.

Accordingly, as shown in FIG. 2, the control signal φ1 rises to the power supply VDD level after the delay time set by the respective capacitors C1 to C5 and the respective inverter circuits 12a to 12d has elapsed after the start-up of the power supply VDD.

The source of the P-channel MOS transistor Tr15 is connected to the power supply VDD, its drain (a node N4) is connected to the power supply Vss via the load circuit 13 and the fuse 14.

Figures 7A, 7B, 7C, 7D:
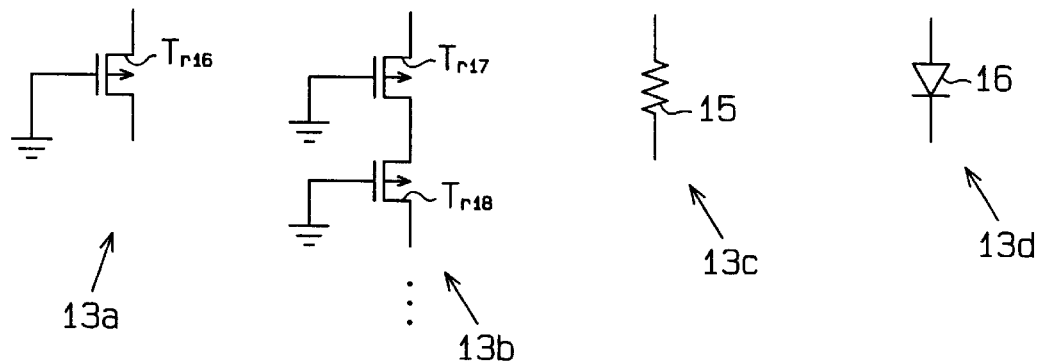
FIGS. 7(a)–7(d) are circuit diagrams of a load circuit of the redundant decision circuit of FIG. 6.

FIGS. 7(a) to 7(d) are circuit diagrams of variations the load circuit 13 may take. The load circuit 13a of FIG. 7(a) is a P-channel MOS transistor Tr16, the gate of which is connected to ground or the power supply Vss. The load circuit 13b of FIG. 7(b) is series connected P-channel MOS transistors Tr17 and Tr18, the gates of which are connected to the ground or power supply Vss. The load circuit 13c of FIG. 7(c) is a resistor 15. The load circuit 13d of FIG. 7(d) is a diode 16. Each element of the various embodiments 13a–13d is set so that the variation of the resistance of the element becomes small for a change in the value of the current flowing therethrough.

Returning to FIG. 6, an input terminal of the hold circuit 17 is connected to a node N4. In the hold circuit 17, a latch circuit 19 including inverter circuits 18a and 18b latches the potential at the node N4. An inverter circuit 18c inverts the output signal of the latch circuit 19 and outputs a redundant signal R. An inverter circuit 18d inverts the output signal of the inverter circuit 18c and outputs a redundant signal /R. When the potential at the node N4 is high, the hold circuit 17 latches and outputs the redundant signal R High and the redundant signal /R Low. When the potential at the node N4 is low, the hold circuit 17 latches and outputs the redundant signal R Low and the redundant signal /R High.

The load circuit 13 causes the potential at the node N4 to rise when the transistor Tr15 is turned on and the fuse 14 is not cut. However, the potential at the node N4 is set to the L level for the threshold of the inverter circuit 18a. This allows the latch circuit 19 to latch the node N4 Low.

When the transistor Tr15 is turned on and a leak current is flowing though the cut fuse 14, the voltage of the load circuit 13 drops. At this time, the potential at the node N4 is set to the H level for the threshold of the inverter circuit 18a. This allows the latch circuit 19 to latch the node N4 potential High.

Figure 8:
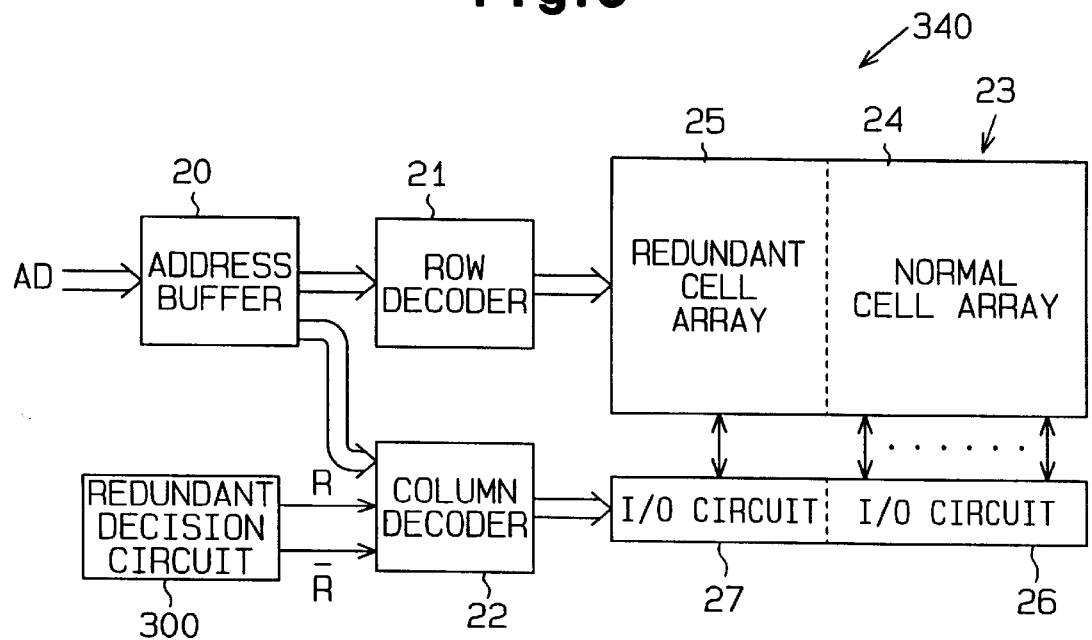
FIG. 8 is a block diagram of a memory device having the redundant decision circuit of FIG. 6.

FIG. 8 is a schematic block diagram of a memory device 340 having the redundant decision circuit 300. An address buffer 20 receives an address signal AD from an external device (not shown) and supplies the address signal AD to a row decoder 21 and a column decoder 22. In accordance with a word line selection signal output from the row decoder 21, a specific word line in a memory cell array 23 is selected. In accordance with a column selection signal output from the column decoder 22, a specific column line in the memory cell array 23 is selected, and, in this manner, a specific memory cell is selected.

The memory cell array 23 has a normal cell array 24 and a redundant array 25 located adjacent to the normal cell array 24. I/O circuits 26 and 27 are located adjacent to the normal and redundant cell arrays 24 and 25, respectively. The column decoder 22 receives the redundant signals R and /R output from the redundant decision circuit 300. When a defective cell is detected in the normal cell array 24 by an operation test, a fuse (not shown) in a redundant decision circuit 300 is cut and the redundant signal R High and the redundant signal /R Low are output from the redundant decision circuit 300. The column decoder 22 selects a redundant column line of the redundant cell array 25 instead of the column line of the defective cell in accordance with the redundant signals R High and /R Low. Thus, a write operation and a read operation are performed for the memory cell connected to the redundant column line via the I/O circuit 26. The redundant signals R and /R may be supplied to the row decoder 21. In this case, a redundant word line of the redundant cell array 25 would be selected instead of the word line of the defective cell.

Next, the operation of the redundant decision circuit 300 (FIG. 6) will be described. As shown in FIG. 2, when the power is turned on and the power supply VDD level starts up, the control signal φ1 rises after a predetermined delay time has elapsed. The transistor Tr15 turns on for the predetermined time t1 until the control signal φ1 rises after the potential difference between the power supply VDD and the control signal φ1 has become greater than the threshold of the transistor Tr15.

In the non-cut state of the fuse 14, the drain current of the transistor Tr15 flows in the power supply Vss via the load circuit 13 and the fuse 14, and the potential at the node N4 is maintained at the L level for the threshold of the inverter circuit 18a. The hold circuit 17 latches the L level potential at the node N4 and outputs the redundant signal R Low and the redundant signal /R High. The hold circuit 17 maintains the redundant signal R Low and the redundant signal /R High even when the transistor Tr15 is turned off, after the predetermined time t1 has elapsed.

In the cut state of the fuse 14, when the transistor Tr15 is turned on during the predetermined time t1, the potential at the node N4 rises to the power supply VDD level. Hereupon, the hold circuit 17 outputs the redundant signal R High and the redundant signal /R Low and maintains the signal state even when the transistor Tr15 is turned off after the predetermined time t1 has elapsed.

When the transistor Tr15 is turned on and a leak current is flowing in the cut fuse 14, the leak current flows in the fuse 14 via the load circuit 13. Hereupon, the voltage drop of the fuse 14 sufficiently increases as compared with the non-cut state of the fuse 14. Then, the potential at the node N4 rises from the power supply Vss due to the voltage drop of the load circuit 13 and the fuse 14 and reaches the H level for the threshold of the inverter circuit 18a. Thus, the hold circuit 17 outputs the redundant signal R High and the redundant signal /R Low.

The characteristics of the redundant decision circuit 300 are described below.

(1) In the non-cut state of the fuse 14, the redundant decision circuit 300 outputs the redundant signal R Low and the redundant signal /R High in accordance with the power-on.

(2) In the cut state of the fuse 14, the redundant decision circuit 300 outputs the redundant signal R High and the redundant signal /R Low in accordance with the power-on.

(3) When a leak current flows in the fuse 14 after the fuse 14 has been cut, the potential at the node N4 is pulled up by the load circuit 13. Accordingly, the redundant decision circuit 300 outputs the redundant signal R High and the redundant signal /R Low.

(4) When the fuse 14 is cut and the power is turned on, the on time of the transistor Tr15 is shortened because the start-up of the power supply VDD is slow. In such a case, since the potential at the node N4 is pulled up by the load circuit 13, the redundant decision circuit 300 outputs the redundant signal R High and the redundant signal /R Low.

(5) Since the delay time of the one-shot pulse generation circuit 11 need not be prolonged even if the on time of the transistor Tr15 is shortened, an increase in the circuit area of the one-shot pulse generation circuit 11 is prevented.

(6) Since the on time of the transistor Tr15 need not be prolonged more than is necessary, the increase of the penetration current, i.e., current consumption flowing in the fuse 14, is prevented when the fuse 14 is not cut.

(7) The memory device 340 accurately performs a redundant operation in accordance with the redundant signal R High and the redundant signal /R Low generated by the redundant decision circuit 300 when the fuse 14 is cut.

(8) The memory device 340 surely performs a redundant operation and prevents the increase of power consumption.

Second Embodiment

Figure 9:
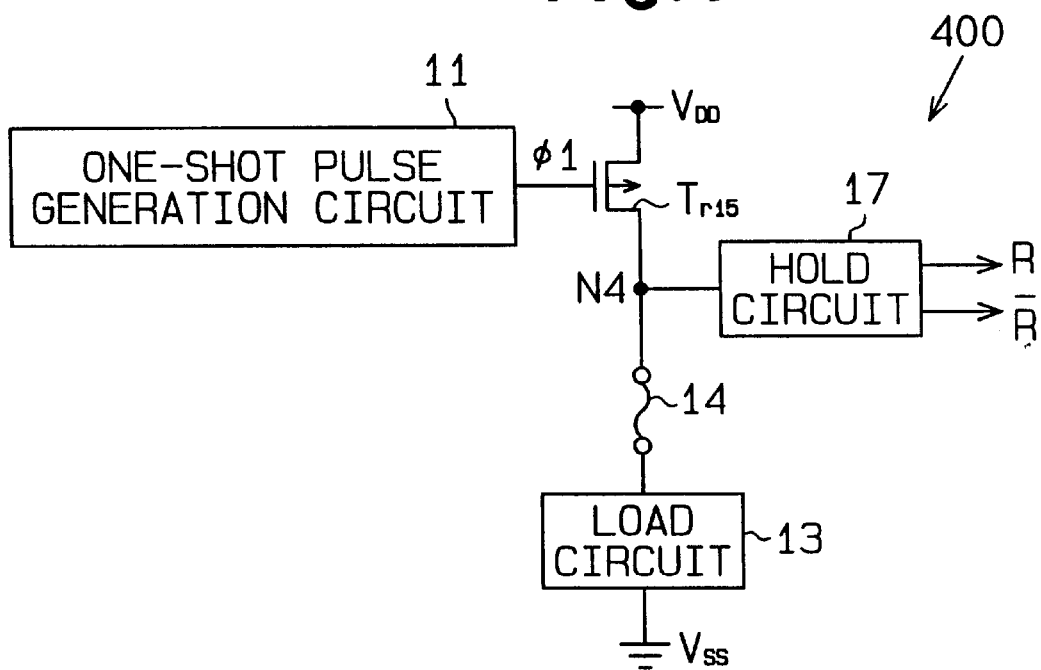
FIG. 9 is a schematic block diagram of a redundant decision circuit according to a second embodiment of the present invention.

FIG. 9 is a schematic block diagram of a redundant decision circuit 400 according to a second embodiment of the present invention. In the second embodiment, the first terminal of the fuse 14 is connected to the node N4, and the second terminal is connected to the power supply Vss via the load circuit 13. In this connection configuration, the load circuit 13 operates in the same manner as the first embodiment.

Third Embodiment

Figure 10:
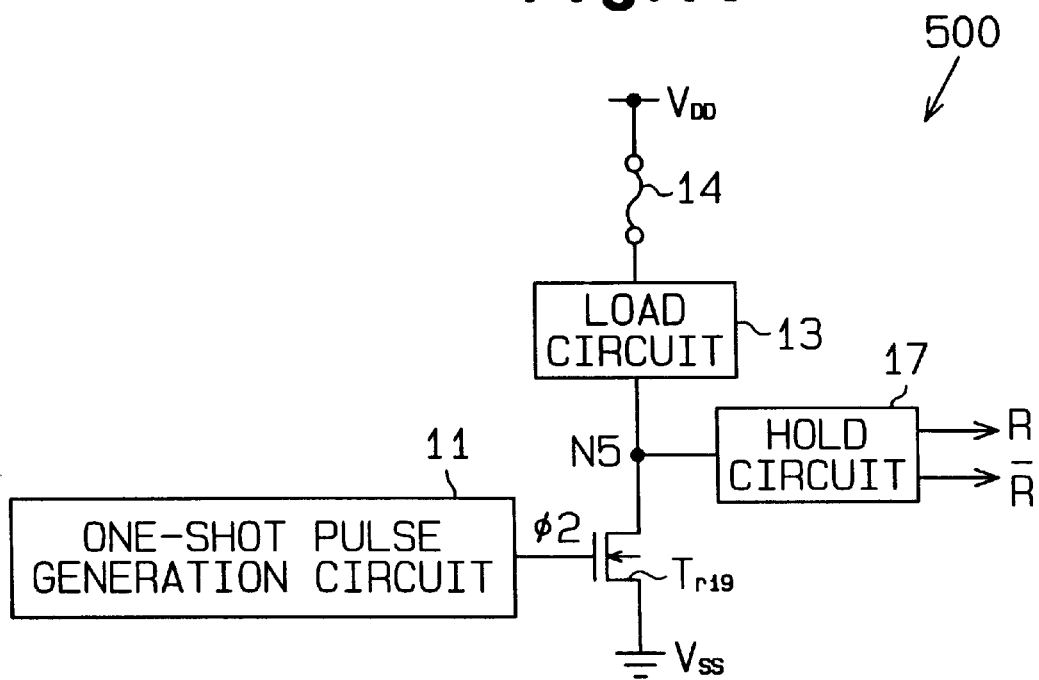
FIG. 10 is a schematic block diagram of a redundant decision circuit according to a third embodiment of the present invention.

FIG. 10 is a schematic block diagram of a redundant decision circuit 500 according to a third embodiment of the present invention. A one-shot pulse generation circuit 11 of the third embodiment outputs a control signal φ2 High for a predetermined time in accordance with the power-on.

The control signal φ2 is applied to the gate of an N-channel MOS transistor Tr19. The source of the transistor Tr19 is connected to the power supply Vss, and the drain (a node N5) is connected to the power supply VDD via a load circuit 13 and the fuse 14.

Figure 12A:
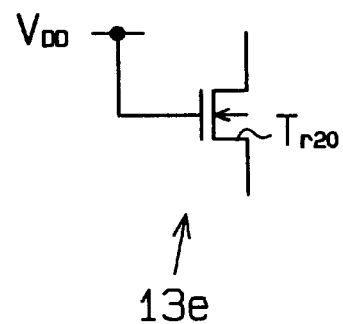
FIGS. 12(a) and 12(b) are circuit diagrams of a load circuit of the redundant decision circuit of FIG. 10.
Figure 12B:
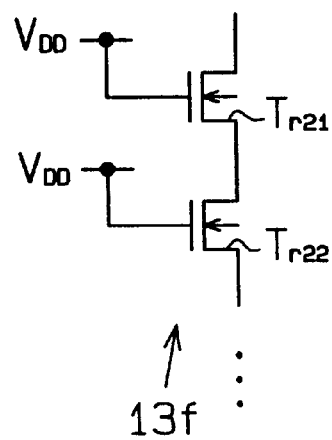

FIGS. 12(a) and 12(b) are circuit diagrams of variations the load circuit 13 may take. The load circuit 13e of FIG. 12(a) is an N-channel MOS transistors Tr20, the gate of which is connected to the power supply VDD. The N-channel MOS transistor Tr20 always holds an on state in response to the power-on of the power supply VDD. The load circuit 13f of FIG. 12(b) is two series connected N-channel MOS transistors Tr21 and Tr22, the gates of which are connected to the power supply VDD. The load circuit 13 may also be a resistor or a diode.

An input terminal of the hold circuit 17 is connected to a node N5. With the circuit 500, a memory device (not shown) stops access to a defective cell of a normal cell array in accordance with the redundant signal R Low and the redundant signal /R High and accesses the redundant cell of a redundant cell array.

Figure 4:
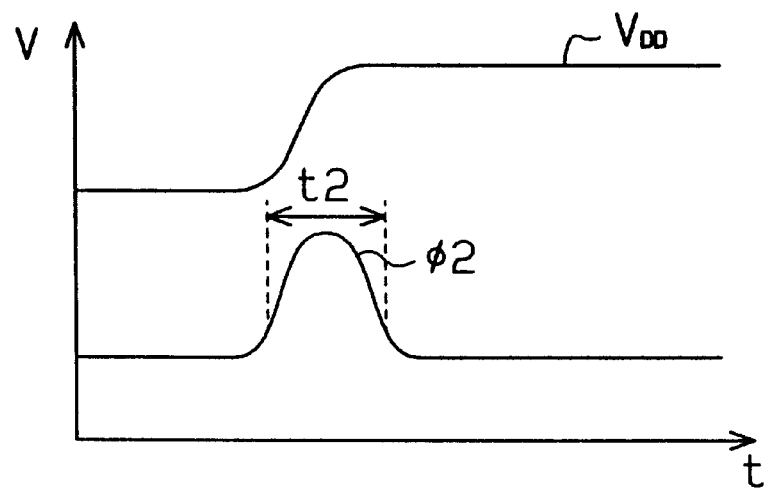
FIG. 4 is a waveform diagram of a power supply and control signal in the redundant decision circuit of FIG. 3.

As shown in FIG. 4, when the power supply VDD level rises due to the power-on, the one-shot pulse generation circuit 11 outputs the control signal φ2 having the power supply VDD level for the predetermined time t2 from the start-up of the power supply VDD. The transistor Tr19 is turned on for the predetermined time t2 until the control signal φ2 falls after the potential difference between the power supply Vss and the control signal φ2 has become greater than the threshold of the transistor Tr19.

In the non-cut state of the fuse 14, a drain current is supplied to the transistor Tr19 from the power supply VDD via the fuse 14 and the load circuit 13. The node N5 potential is maintained at the H level for the threshold of the inverter circuit 18a of the hold circuit 17 according to the resistance ratio of the fuse 14 and the load circuit 13 to the transistor Tr19. The hold circuit 17 latches the H level potential at the node N5 and outputs the redundant signal R High and the redundant signal /R Low. The hold circuit 17 maintains the redundant signal R High and the redundant signal /R Low even if the transistor Tr19 is turned off after the predetermined time t2 has elapsed.

In the cut state of the fuse 14, when the transistor Tr19 is turned on for the predetermined time t2, the potential at the node N5 drops to substantially the power supply Vss level. The hold circuit 17 outputs the redundant signal R Low and the redundant signal /R High and maintains the redundant signal R Low and the redundant signal /R High even if the transistor Tr19 is turned off after the predetermined time t2 has elapsed.

When the transistor Tr19 is turned on when a leak current is flowing in the fuse 14 even though the fuse 14 is cut, the leak current flows from the fuse 14 to the load circuit 13. At this time, the voltage drop of the fuse 14 is sufficiently large as compared with the non-cut state of the fuse circuit 14. Accordingly, the potential at the node N5 drops from the power supply VDD by the voltage drop of the load circuit 13 and the fuse 14 and reaches the L level for the threshold of the inverter circuit 18a. Thus, the hold circuit 17 outputs the redundant signal R Low and the redundant signal /R High.

The operation of the redundant decision circuit 500 is the same as the first embodiment except that the redundant signals R and /R output from the hold circuit 17 are reversed.

Fourth Embodiment

Figure 11:
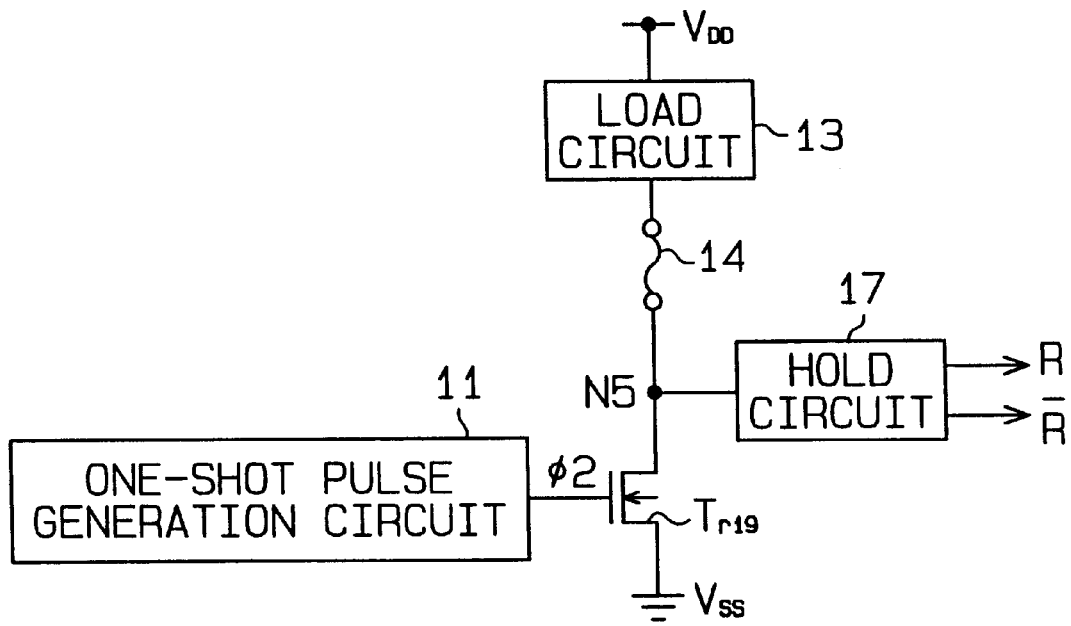
FIG. 11 is a schematic block diagram of a redundant decision circuit according to a fourth embodiment of the present invention.

FIG. 11 is a schematic block diagram of a redundant decision circuit according to a fourth embodiment of the present invention. In the fourth embodiment, the first terminal of the fuse 14 is connected to the node N5 and its second terminal is connected to the power supply VDD via the load circuit 13. In this connection configuration, the load circuit 13 operates in the same manner as in the first embodiment.

It should be apparent to those skilled in the art that the present invention may be embodied in many other specific forms without departing from the spirit or scope of the invention. Particularly, it should be understood that the invention may be embodied in a memory device having any one of the redundant decision circuits. Further, each such memory embodiment may be stored in a library as a RAM macro and the library may be distributed to customers. Therefore, the present examples and embodiments are to be considered as illustrative and not restrictive and the invention is not to be limited to the details given herein, but may be modified within the scope and equivalence of the appended claims.

What is claimed is:

1. A redundant decision circuit, comprising:
   a switching element;
   a switching driver connected to the switching element for driving the switching element;
   a fuse;
   a load circuit connected in series with the fuse, wherein one of the fuse and the load circuit is connected to the switching element; and
   a hold circuit, connected to a node between the switching element and one of the fuse and the load circuit, for latching a potential at the node and generating a redundant decision signal, wherein the switching element is a P-channel MOS transistor and the load circuit is a P-channel MOS transistor the gate of which is connected to a low potential power supply.

2. The circuit of claim 1, wherein the load circuit generates a voltage drop in accordance with a current flowing in the fuse.

3. A redundant decision circuit, comprising:
   a switching element connected between a high potential power supply and a node;
   a switching driver connected to the switching element for driving the switching element;
   a fuse;
   a load circuit connected in series with the fuse between a low potential power supply and the node; and
   a hold circuit, connected to the node, for latching a potential at the node and generating a redundant decision signal.

4. The circuit of claim 3, wherein the load circuit generates a voltage drop in accordance with a current flowing in the fuse.

5. The circuit of claim 3, wherein the switching element is a P-channel MOS transistor and the load circuit is a P-channel MOS transistor the gate of which is connected to the low potential power supply.

6. The circuit of claim 3, wherein the switching element is a P-channel MOS transistor and the load circuit is two series connected P-channel MOS transistors the gates of which are connected to the low potential power supply.

7. The circuit of claim 3, wherein the switching element is a P-channel MOS transistor and the load circuit is a resistor.

8. The circuit of claim 3, wherein the switching element is a P-channel MOS transistor and the load circuit is a diode.

9. A semiconductor memory device, comprising:

a memory cell array including a normal cell array and a redundant cell array;

a redundant decision circuit for generating a redundant decision signal; and a decoder, connected to the redundant decision circuit, for performing a redundant operation to select a normal cell of the normal cell array or a redundant cell of the redundant cell array in accordance with the redundant decision signal, the redundant decision circuit including, a switching element, a switching driver connected to the switching element for driving the switching element, a fuse, a load circuit connected in series with the fuse, one of the fuse and the load circuit being connected to the switching element, and a hold circuit, connected to a node between the switching element and one of the fuse and the load circuit, for latching a potential at the node and generating the redundant decision signal.

10. A semiconductor memory device, comprising:

a memory cell array including a normal cell array and a redundant cell array;

a redundant decision circuit for generating a redundant decision signal; and a decoder, connected to the redundant decision circuit, for performing a redundant operation to select a normal cell of the normal cell array or a redundant cell of the redundant cell array in accordance with the redundant decision signal, the redundant decision circuit including, a switching element connected between a high potential power supply and a node, a switching driver connected to the switching element for driving the switching element, a fuse, a load circuit connected in series with the fuse between a low potential power supply and the node, and a hold circuit, connected to the node, for latching a potential at the node and generating the redundant decision signal.

11. A method for deciding redundancy, comprising the steps of:

connecting a fuse, a load circuit and a switching element in series between a high potential power supply and a low potential power supply;

driving the switching element to generate a potential at a node between the switching element and the fuse, the potential at the node varying by a voltage drop generated by the load circuit; and holding the potential at the node to generate a redundant decision signal.

12. A method for deciding redundancy, comprising the steps of:

connecting a switching element to a high potential power supply;

connecting a fuse and a load circuit in series between the switching element and a low potential power supply;

driving the switching element to generate a potential at a node between the switching element and the fuse, the potential at the node increasing by a voltage drop generated by the load circuit; and holding the potential at the node to generate a redundant decision signal.

13. A redundant decision circuit comprising:

a switching element;

a switching driver connected to the switching element for driving the switching element;

a fuse;

a load circuit connected in series with the fuse, wherein one of the fuse and the load circuit is connected to the switching element; and a hold circuit, connected to a node between the switching element and one of the fuse and the load circuit, for latching a potential at the node and generating a redundant decision signal, wherein the switching element is a P-channel MOS transistor and the load circuit is two series connected P-channel MOS transistors the gates of which are connected to a low potential power supply.

14. A redundant decision circuit comprising:

a switching element;

a switching driver connected to the switching element for driving the switching element;

a fuse;

a load circuit connected in series with the fuse, wherein one of the fuse and the load circuit is connected to the switching element; and a hold circuit, connected to a node between the switching element and one of the fuse and the load circuit, for latching a potential at the node and generating a redundant decision signal, wherein the switching element is a P-channel MOS transistor and the load circuit is a resistor.

15. A redundant decision circuit comprising:

a switching element;

a switching driver connected to the switching element for driving the switching element;

a fuse;

a load circuit connected in series with the fuse, wherein one of the fuse and the load circuit is connected to the switching element; and a hold circuit, connected to a node between the switching element and one of the fuse and the load circuit, for latching a potential at the node and generating a redundant decision signal, wherein the switching element is a P-channel MOS transistor and the load circuit is a diode.

* * * * *